(12) United States Patent
Enya et al.

(10) Patent No.: US 11,609,423 B2
(45) Date of Patent: Mar. 21, 2023

(54) MIRROR DRIVING MECHANISM AND OPTICAL MODULE

(71) Applicant: SUMITOMO ELECTRIC INDUSTRIES, LTD., Osaka (JP)

(72) Inventors: Yohei Enya, Osaka (JP); Shinya Ito, Osaka (JP); Takashi Kyono, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 523 days.

(21) Appl. No.: 16/627,883

(22) PCT Filed: Mar. 19, 2019

(86) PCT No.: PCT/JP2019/011431
§ 371 (c)(1),
(2) Date: Dec. 31, 2019

(87) PCT Pub. No.: WO2019/230144
PCT Pub. Date: Dec. 5, 2019

(65) Prior Publication Data
US 2020/0132985 A1  Apr. 30, 2020

(30) Foreign Application Priority Data

May 28, 2018  (JP) .............................. JP2018-101751

(51) Int. Cl.
*G02B 26/10* (2006.01)
*G02B 26/08* (2006.01)
(Continued)

(52) U.S. Cl.
CPC ....... *G02B 26/105* (2013.01); *G02B 26/0858* (2013.01); *G02B 27/0966* (2013.01); *H01S 5/022* (2013.01)

(58) Field of Classification Search
CPC .............................. G02B 26/101; G02B 26/105
See application file for complete search history.

(56) References Cited

U.S. PATENT DOCUMENTS 10,473,924 B2 * 11/2019 Yoshida ................. G02B 26/08
10,795,148 B2 * 10/2020 Rocznik ............ G02B 26/0833
(Continued)

FOREIGN PATENT DOCUMENTS

EP           3 37 0048 A1    9/2018
JP        2008-039939 A     2/2008
(Continued)

OTHER PUBLICATIONS

Jun. 4, 2019 Search Report issued in International Patent Application No. PCT/JP2019/011431.

*Primary Examiner* — Christopher Stanford
(74) *Attorney, Agent, or Firm* — Oliff PLC

(57) ABSTRACT

A mirror driving mechanism includes a plate-shaped base portion, a mirror that is installed at the base portion, and a temperature detecting section that is installed at the base portion and that detects a temperature of the base portion. The base portion includes a thin portion that is disposed away from an outer edge of the base portion and that has a through hole extending through the base portion in a plate-thickness direction of the base portion, a thick portion that is connected to the thin portion, that is thicker than the thin portion in the plate-thickness direction of the base portion, and that extends along the outer edge so as to surround the thin portion, and a first shaft portion extends into the through hole from an outer periphery of the through hole.

17 Claims, 9 Drawing Sheets

(51) Int. Cl.
  *G02B 27/09* (2006.01)
  *H01S 5/022* (2021.01)

(56) References Cited

U.S. PATENT DOCUMENTS

2015/0234263 A1   8/2015   Yamagiwa et al.
2018/0172985 A1   6/2018   Yoshida et al.

FOREIGN PATENT DOCUMENTS

| | | | |
|---|---|---|---|
| JP | 2008039939 A | * | 2/2008 |
| JP | 2014-056199 A | | 3/2014 |
| JP | 2014-186068 A | | 10/2014 |
| JP | 2015-194705 A | | 11/2015 |
| JP | 2016-224211 A | | 12/2016 |
| JP | 2018-40791 A | | 3/2018 |
| WO | 2007/120831 A2 | | 10/2007 |

* cited by examiner

MIRROR DRIVING MECHANISM AND OPTICAL MODULE

TECHNICAL FIELD

The present disclosure relates to a mirror driving mechanism and an optical module.

This application claims priority to Japanese Patent Application No. 2018-101751, filed May 28, 2018, the contents of which are incorporated herein by reference in its entirety.

BACKGROUND ART

An optical module that includes a light-emitting section that combines light rays emitted from a plurality of semiconductor light-emitting elements, and a scanning section that performs scanning by using light emitted from the light-emitting section is known (refer to, for example, PTL 1 to PTL 3). Such an optical module is capable of drawing, for example, characters and figures by performing scanning along a desired path by using the light emitted from the light-emitting section.

CITATION LIST

Patent Literature

PTL 1: Japanese Unexamined Patent Application Publication No. 2014-186068
PTL 2: Japanese Unexamined Patent Application Publication No. 2014-56199
PTL 3: WO2007/120831

SUMMARY OF INVENTION

A mirror driving mechanism according to the present disclosure includes a plate-shaped base portion, a mirror that is installed at the base portion, and a temperature detecting section that is installed at the base portion and that detects a temperature of the base portion. The base portion includes a thin portion that is disposed away from an outer edge of the base portion and that has a through hole extending through the base portion in a plate-thickness direction of the base portion, a thick portion that is connected to the thin portion, that is thicker than the thin portion in the plate-thickness direction of the base portion, and that extends along the outer edge so as to surround the thin portion, and a first shaft portion that extends into the through hole from an outer periphery of the through hole. The mirror is supported by the first shaft portion so as to be swingable due to resonance with respect to the thin portion with the first shaft portion being a swing axis.

DESCRIPTION OF EMBODIMENTS OF INVENTION

Figure 1:
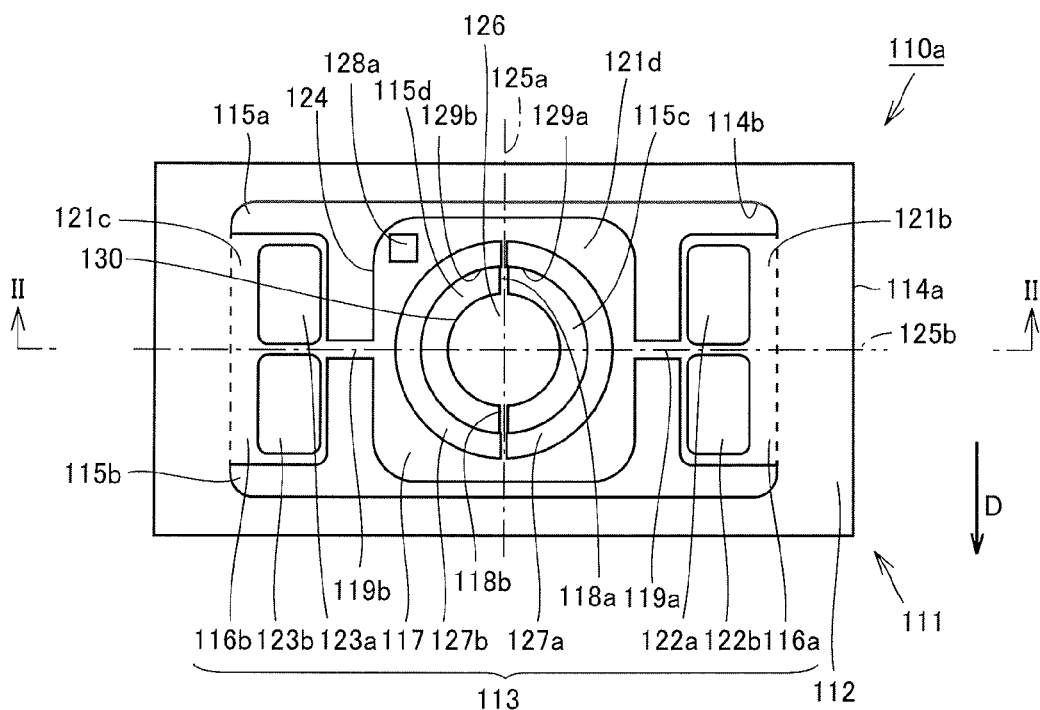
FIG. 1 is a schematic plan view showing a mirror driving mechanism in a first embodiment.

Problems to be Solved by Present Disclosure

In performing scanning along a desired path by using light from a light-emitting section, reflection by a swingable mirror may be utilized. The mirror is required to swing stably.

Accordingly, it is an object to provide a mirror driving mechanism and an optical module, which are capable of stably swinging a mirror.

Advantageous Effects of Present Disclosure

According to the mirror driving mechanism, it is possible to provide a mirror driving mechanism that is capable of stably swinging a mirror.

Description of Embodiments of Present Disclosure

First, embodiments of the present disclosure are enumerated and described. A mirror driving mechanism of the present disclosure includes a plate-shaped base portion, a mirror that is installed at the base portion, and a temperature detecting section that is installed at the base portion and that detects a temperature of the base portion. The base portion includes a thin portion that is disposed away from an outer edge of the base portion and that has a through hole extending through the base portion in a plate-thickness direction of the base portion, a thick portion that is connected to the thin portion, that is thicker than the thin portion in the plate-thickness direction of the base portion, and that extends along the outer edge so as to surround the thin portion, and a first shaft portion that extends into the through hole from an outer periphery of the through hole. The mirror is supported by the first shaft portion so as to be swingable due to resonance with respect to the thin portion with the first shaft portion being a swing axis.

Regarding the mirror swinging mechanism that swings the mirror, the mirror may have difficulty swinging stably. The present inventor et al. have studied the causes thereof. As a result thereof, the present inventor et al. have found out the following.

The mirror that is supported so as to be swingable due to resonance is swingable at a high speed. However, a change in an optical swing angle caused by temperature may be large. In order to stably swing the mirror, it is desirable to precisely detect the temperature of the mirror driving mechanism and strictly control the temperature. In the mirror driving mechanism, since the temperature detecting section that detects the temperature is installed at the base portion, it is possible to precisely detect the temperature of the mirror driving mechanism. Therefore, it is possible to strictly control the temperature of the mirror driving mechanism based on the detected temperature of the mirror driving mechanism. As a result, it is possible to adjust the temperature of the mirror driving mechanism in a proper range. Consequently, the mirror driving mechanism is capable of stably swinging the mirror.

In the mirror driving mechanism, the temperature detecting section may be installed at the thick portion. This makes it easy to install the temperature detecting section at the base portion.

In the mirror driving mechanism, the temperature detecting section may be installed at the thin portion. The influence of the temperature of the thin portion on the optical swing angle is large. By installing the temperature detecting section at the thin portion, it is possible to precisely detect the temperature of the thin portion. Therefore, it is possible to more stably swing the mirror.

In the mirror driving mechanism, the thin portion may include a first portion that is connected to the thick portion, and a second portion that is connected to the first portion and that has the through hole. The temperature detecting section is installed at the second portion. The influence of the temperature of the second portion on the stability of the operation of the mirror is large. By installing the temperature detecting section at the second portion, it is possible to precisely detect the temperature of the second portion. Therefore, it is possible to more stably swing the mirror.

In the mirror driving mechanism, the base portion may further include a second shaft portion that extends in a direction orthogonal to the first shaft portion and that connects the first portion and the second portion to each other. The second portion may be supported by the second shaft portion so as to be swingable with respect to the first portion with the second shaft portion being a swing axis. This makes it possible to swing the mirror with the second shaft portion extending in the direction orthogonal to the first shaft portion being a swing axis, in addition to swinging the mirror with the first shaft portion being a swing axis. Therefore, since the mirror swings with the first shaft portion and the second shaft portion being swing axes, it becomes easy to perform two-dimensional drawing using reflected light from the mirror.

In the mirror driving mechanism, the mirror may be swingable due to a piezoelectric phenomenon with the second shaft portion being a swing axis. This allows the optical swing angle of the mirror with the second shaft portion being a swing axis to be large. In addition, since a magnet is not included as it is in the type that uses an electromagnetic driving system, it is possible to reduce the size. Therefore, it becomes easy to reduce the size of the mirror driving mechanism. Although the dependence of the swinging caused by the piezoelectric phenomenon on temperature is increased, since it is possible to precisely detect the temperature of the mirror driving mechanism and adjust the temperature of the mirror driving mechanism in a proper range, even under an environment in which the temperature changes, it is possible to stably swing the mirror.

In the mirror driving mechanism, the mirror may be swingable due to a piezoelectric phenomenon with the first shaft portion being a swing axis. Such a mirror driving mechanism makes it possible to increase the optical swing angle of the mirror with the first shaft portion being a swing axis.

In the mirror driving mechanism, the thin portion may include a silicon layer, and a piezoelectric element that is disposed on the silicon layer. The temperature detecting section may be a silicon diode that is disposed on the silicon layer. When manufacturing the mirror driving mechanism by using, for example, a silicon-on-insulator (SOI) wafer, it is possible to efficiently form the silicon layer and the piezoelectric element that allows the use of a piezoelectric phenomenon. In addition, it becomes easy to form the temperature detecting section, which is a silicon diode, during a manufacturing process. Therefore, compared to a case in which a separately prepared temperature detecting section is installed, it is possible to simply the manufacturing process.

The mirror driving mechanism may further include a first electronic temperature adjusting module that adjusts a temperature of the mirror driving mechanism by controlling an output based on a signal from the temperature detecting section. Therefore, by controlling the temperature by the first electronic temperature adjusting module based on temperature information detected by the temperature detecting section, it becomes easy to adjust the temperature of the mirror driving mechanism in a proper range.

An optical module according to the present disclosure includes any one of the mirror driving mechanisms above, and a laser diode that emits a light ray with which scanning is performed by driving the mirror.

The optical module of the present disclosure includes a mirror driving mechanism that is capable of stably swinging the mirror. Therefore, it is possible to stabilize the operation of the optical module.

The optical module may further include a base member where the laser diode is installed, and a second electronic temperature adjusting module that adjusts a temperature of the base member. Light that is emitted by the laser diode depends upon temperature. Therefore, by using the second electronic temperature adjusting module that differs from the first electronic temperature adjusting module that adjusts the temperature of the mirror driving mechanism, it is possible to adjust the temperature of the laser diode separately from adjusting the temperature of the mirror driving mechanism. Consequently, it is possible to properly adjust the temperature of the laser diode.

The optical module may further include a beam shaping section that shapes, in a cross section perpendicular to a direction of propagation of a light ray that is emitted from the laser diode, the light ray that is emitted from the laser diode. This makes it possible to reflect the light ray that has been shaped into a desired shape.

The optical module may further include a light-receiving element that receives a light ray that is emitted from the laser diode. This makes it possible to properly adjust the output of the laser diode based on the output of the light ray that is received by the light-receiving element.

The optical module may further include a lens that converts a spot size of a light ray that is emitted from the laser diode. This makes it possible to emit the light ray having a desired spot size from the optical module.

In the optical module, a plurality of the laser diodes may be provided, and the optical module may further include a filter that combines a plurality of the light rays that are emitted from the plurality of laser diode. The plurality of laser diodes may include a red laser diode that emits a red light ray, a green laser diode that emits a green light ray, and a blue laser diode that emits a blue light ray. This makes it possible to emit light acquired by combining the light rays emitted from the plurality of laser diodes from the optical module. In this case, it is possible to combine the light rays and form light having a desired color.

Details of Embodiments of Present Disclosure

Next, embodiments of a mirror driving mechanism and an optical module according to the present disclosure are described with reference to the drawings. In the figures below, the same or corresponding portions are given the same reference numerals and their descriptions are not repeated.

First Embodiment

Figure 2:
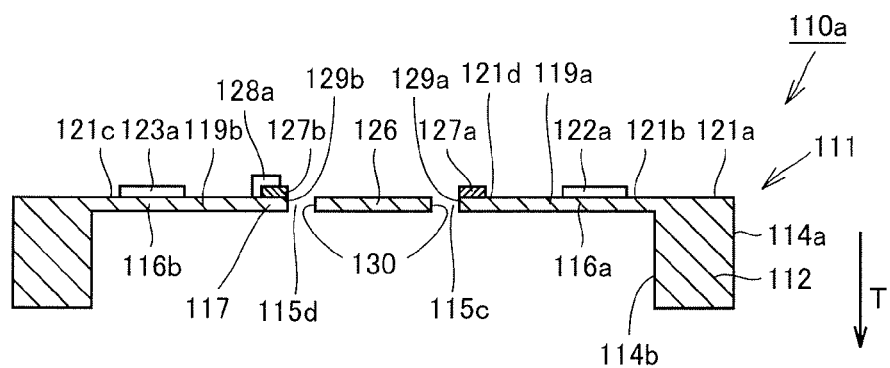
FIG. 2 is a schematic sectional view of the mirror driving mechanism in the first embodiment, the mirror driving mechanism being cut along a line segment II-II.

First, a first embodiment is described with reference to FIGS. 1 and 2. FIG. 1 is a schematic plan view showing a mirror driving mechanism in the first embodiment. FIG. 2 is a schematic sectional view of the mirror driving mechanism in the first embodiment, the mirror driving mechanism being cut along a line segment II-II.

With reference to FIGS. 1 and 2, a mirror driving mechanism 110a in the present embodiment includes a plate-shaped base portion 111. As shown in FIG. 1, when the base portion 111 is viewed in a plate-thickness direction, the base portion 111 has a rectangular shape. The length of each short side of the base portion 111 is, for example, 4.5 mm. The length of each long side of the base portion 111 is, for example, 8 mm. Each short side of the base portion 111 extends in the direction of arrow D in FIG. 1. Through holes 115a, 115b, 115c, and 115d extending through the base portion 111 in the plate-thickness direction are formed in the base portion 111. Corner portions of outer edges 114a of the base portion 111 may be chamfered. The plate-thickness direction of the base portion 111 is the direction of arrow T in FIG. 2.

The base portion 111 includes a thin portion 113, a thick portion 112 that is thicker than the thin portion 113 in the plate-thickness direction of the base portion 111, a pair of first shaft portions 118a and 118b, and a pair of second shaft portions 119a and 119b. The thickness of the thin portion 113 in the plate-thickness direction is, for example, 10 µm. The thin portion 113 is disposed away from the outer edges 114a of the base portion 111. The thick portion 112 is disposed so as to surround the thin portion 113. The thick portion 112 has a shape extending along the outer edges 114a. When the thick portion 112 is viewed in the plate-thickness direction, the thick portion 112 is disposed so as to include the outer edges 114a of the mirror driving mechanism 110a. When the thick portion 112 is viewed in the plate-thickness direction, the thick portion 112 has a shape including a pair of long sides and a pair of short sides. The thick portion 112 has a ring shape. As described below, the mirror driving mechanism 110a is manufactured by using a silicon-on-insulator (SOI) wafer. The thin portion 113 includes a silicon layer and piezoelectric elements (described below) that are disposed on the silicon layer.

The thin portion 113 includes a pair of first portions 116a and 116b, and a second portion 117. In FIG. 1, a boundary between the thick portion 112 and the first portion 116a and a boundary between the thick portion 112 and the first portion 116b are each indicated by a broken line. The pair of first portions 116a and 116b are each connected to the thick portion 112. The pair of first portions 116a and 116b are disposed so as to project towards each other from corresponding inner edges 114b of the thick portion 112. When the second portion 117 is viewed in the plate-thickness direction, the second portion has a rectangular shape. One surface 121a of the thick portion 112 in the plate-thickness direction is formed consecutively with one surface 121b of the first portion 116a in the plate-thickness direction and one surface 121c of the first portion 116b in the plate-thickness direction (see, in particular, FIG. 2).

The pair of second shaft portions 119a and 119b have the form of thin rods. The pair of second shaft portions 119a and 119b are each connected to a corresponding one of the pair of first portions 116a and 116b. The pair of second shaft portions 119a and 119b are each connected to a portion of a corresponding one of outer edges 124 of the second portion 117.

The second portion 117 has the through holes 115c and 115d. The through holes 115a and 115b are disposed between the second portion 117 and each of the pair of first portions 116a and 116b, between the second portion 117 and the thick portion 112, and between each of the pair of first portions 116a and 116b and the thick portion 112 so as to exclude a region where the pair of second shaft portions 119a and 119b are disposed. The second portion 117 is supported by the pair of second shaft portions 119a and 119b so as to be swingable with respect to the pair of first portions 116a and 116b with the pair of second shaft portions 119a and 119b being swing axes.

The mirror driving mechanism 110a includes a mirror 126. The mirror 126 is installed on the base portion 111. The mirror 126 reflects light incident from the outside of the mirror driving mechanism 110a. The mirror 126 has a disc shape. The diameter of the mirror 126 is, for example, 1.2 mm. For example, a metal, such as aluminum, is vapor-deposited onto a mirror surface of the mirror 126.

The pair of first shaft portions 118a and 118b have the form of thin rods. The pair of first shaft portions 118a and 118b extend into the through holes 115c and 115d from outer peripheries 129a and 129b of the through holes 115c and 115d. The pair of first shaft portions 118a and 118b are each connected to an outer edge 130 of the mirror 126. The pair of through holes 115c and 115d are disposed between the second portion 117 and the mirror 126 so as to exclude a region where the pair of first shaft portions 118a and 118b are disposed. The mirror 126 is supported by the pair of first shaft portions 118a and 118b so as to be swingable due to resonance with respect to the thin portion 113 with the pair of first shaft portions 118a and 118b being swing axes.

The thin portion 113 includes a pair of piezoelectric elements 122a and 122b. The pair of piezoelectric elements 122a and 122b are disposed on the one surface 121b of the first portion 116a in the plate-thickness direction. The piezoelectric elements 122a and 122b are disposed apart from each other in the direction of arrow D. When the piezoelectric elements 122a and 122b are viewed in the plate-thickness direction, the piezoelectric elements 122a and 122b each have a rectangular shape. Similarly, the thin portion 113 includes a pair of piezoelectric elements 123a and 123b. The pair of piezoelectric elements 123a and 123b each having a rectangular shape when viewed in the plate-thickness direction are disposed apart from each other in the direction of arrow D on the one surface 121c of the first portion 116b in the plate-thickness direction.

By alternately applying voltages having opposite phases to the respective piezoelectric elements 122a and 122b and alternately applying voltages having opposite phases to the respective piezoelectric elements 123a and 123b, it is possible to swing the second portion 117 with respect to the first portions 116a and 116b with the pair of second shaft portions 119a and 119b being swing axes. In this case, a second imaginary line 125b that extends through the pair of second shaft portions 119a and 119b and that is indicated by an alternate long and short dashed line is the center axis of swinging. In this way, it is possible to swing the second portion 117 due to a piezoelectric phenomenon with the pair of second shaft portions 119a and 119b being swing axes. Here, the second portion 117 is swung at a frequency at which the second portion 117 does not resonate with the mirror 126. The optical swing angle of the swinging of the second portion 117 is, for example, ±15 degrees.

The thin portion 113 includes a pair of piezoelectric elements 127a and 127b. The piezoelectric elements 127a and 127b are each disposed on the one surface 121d of the second portion 117 in the plate-thickness direction. The piezoelectric element 127a is disposed along the outer periphery 129a of the through hole 115c. The piezoelectric element 127b is disposed along the outer periphery 129b of the through hole 115d.

By alternately applying voltages having opposite phases to the respective piezoelectric elements 127a and 127b, it is possible to swing the mirror 126 with respect to the second portion 117 with the pair of first shaft portions 118a and 118b being swing axes. In this case, a first imaginary line 125a that extends through the pair of first shaft portions 118a and 118b and that is indicated by an alternate long and short dashed line is the center axis of swinging. This makes it is possible to swing the mirror 126 due to a piezoelectric phenomenon with the pair of first shaft portions 118a and 118b being swing axes. Here, the mirror 126 resonates. That is, the mirror 126 vibrates in accordance with the natural frequency of the mirror 126. This makes it easy to swing the mirror 126 at a high speed. In addition, this makes it possible to increase the optical swing angle of the swinging of the mirror 126. The optical swing angle is, for example, ±40 degrees. In plan view of the mirror driving mechanism 110a shown in FIG. 1, the first imaginary line 125a and the second imaginary line 125b are orthogonal to each other.

Here, the mirror driving mechanism 110a includes a temperature detecting section 128a that detects the temperature of the base portion 111. The temperature detecting section 128a is installed on the base portion 111. Specifically, the temperature detecting section 128a is mounted on the one surface 121d of the second portion 117 in the plate-thickness direction. More specifically, when the temperature detecting section 128a is viewed in the plate-thickness direction, the temperature detecting section 128a is disposed in a region between the piezoelectric element 127b and the corresponding outer edge 124 of the second portion 117. The temperature detecting section 128a is a silicon diode.

Next, a method of manufacturing the mirror driving mechanism 110a is simply described. First, a silicon-on-insulator (SOI) substrate is prepared, and, for example, a silicon oxide film is formed on the substrate. Then, by forming a photoresist layer, performing reactive ion etching, etc., for example, the piezoelectric elements are formed on predetermined locations to acquire the above-described mirror driving mechanism 110a.

The mirror 126 that is supported so as to be swingable due to resonance is swingable at a high speed. However, a change in the optical swing angle due to temperature may be large. In order to stably swing the mirror 126, it is desirable to precisely detect the temperature of the mirror driving mechanism 110a and strictly control the temperature. In the mirror driving mechanism 110a, since the temperature detecting section 128a that detects the temperature is installed on the base portion 111, it is possible to precisely detect the temperature of the mirror driving mechanism 110a. Therefore, it is possible to strictly control the temperature of the mirror driving mechanism 110a based on the detected temperature of the mirror driving mechanism 110a. As a result, it is possible to adjust the temperature of the mirror driving mechanism 110a in a proper range. Consequently, the mirror driving mechanism 110a is capable of stably swinging the mirror 126.

In the present embodiment, the temperature detecting section 128a is installed on the second portion 117 of the thin portion 113. The influence of the temperature of the second portion 117 on the stability of the operation of the mirror 126 is large. By installing the temperature detecting section 128a on the second portion 117, it is possible to precisely detect the temperature of the second portion 117. Therefore, it is possible to more stably swing the mirror 126.

In the present embodiment, the base portion 111 includes the second shaft portions 119a and 119b that extend in a direction orthogonal to the pair of first shaft portions 118a and 118b and that each connect a corresponding one of the pair of first portions 116a and 116b and the second portion 117 to each other. The second portion 117 is supported by the pair of second shaft portions 119a and 119b so as to be swingable with respect to the pair of first portions 116a and 116b with the pair of second shaft portions 119a and 119b being swing axes. Therefore, it is possible to swing the mirror 126 with the pair of second shaft portions 119a and 119b extending in the direction orthogonal to the pair of first shaft portions 118a and 118b being swing axes, in addition to swinging the mirror 126 with the pair of first shaft portions 118a and 118b being swing axes. Therefore, since the mirror 126 swings with the pair of first shaft portions 118a and 118b and the pair of second shaft portions 119a and 119b being swing axes, it becomes easy to perform two-dimensional drawing using reflected light from the mirror 126.

In the present embodiment, the mirror 126 is swingable due to a piezoelectric phenomenon with the pair of second shaft portions 119a and 119b being swing axes. Therefore, the optical swing angle of the mirror 126 with the pair of second shaft portions 119a and 119b being swing axes can be large. In addition, since a magnet is not included as it is in the type that uses an electromagnetic driving system, it is possible to reduce the size. Consequently, it becomes easy to reduce the size of the mirror driving mechanism 110a. Although the dependence of the swinging caused by the piezoelectric phenomenon on temperature is increased, since it is possible to precisely detect the temperature of the mirror driving mechanism 110a and adjust the temperature of the mirror driving mechanism 110a in a proper range, even under an environment in which the temperature changes, it is possible to stably swing the mirror 126.

In the present embodiment, the mirror 126 is swingable due to a piezoelectric phenomenon with the pair of first shaft portions 118a and 118b being swing axes. Such a mirror driving mechanism 110a makes it possible to increase the optical swing angle of the mirror 126 with the pair of first shaft portions 118a and 118b being swing axes. In addition, it becomes easy to reduce the size of the mirror driving mechanism 110a.

In the present embodiment, the thin portion 113 includes the silicon layer and the piezoelectric elements 122a, 122b, 123a, 123b, 127a, and 127b that are disposed on the silicon layer. The temperature detecting section 128a is a silicon diode that is disposed on the silicon layer. When manufacturing the mirror driving mechanism 110a by using, for example, a silicon-on-insulator (SOI) wafer, it is possible to efficiently form the silicon layer and the piezoelectric elements 122a, 122b, 123a, 123b, 127a, and 127b that allow the use of a piezoelectric phenomenon. In addition, it becomes easy to form the temperature detecting section 128a, which is a silicon diode, during a manufacturing process. Therefore, compared to the case in which a separately prepared temperature detecting section 128a is installed, it is possible to simply the manufacturing process.

Figure 3:
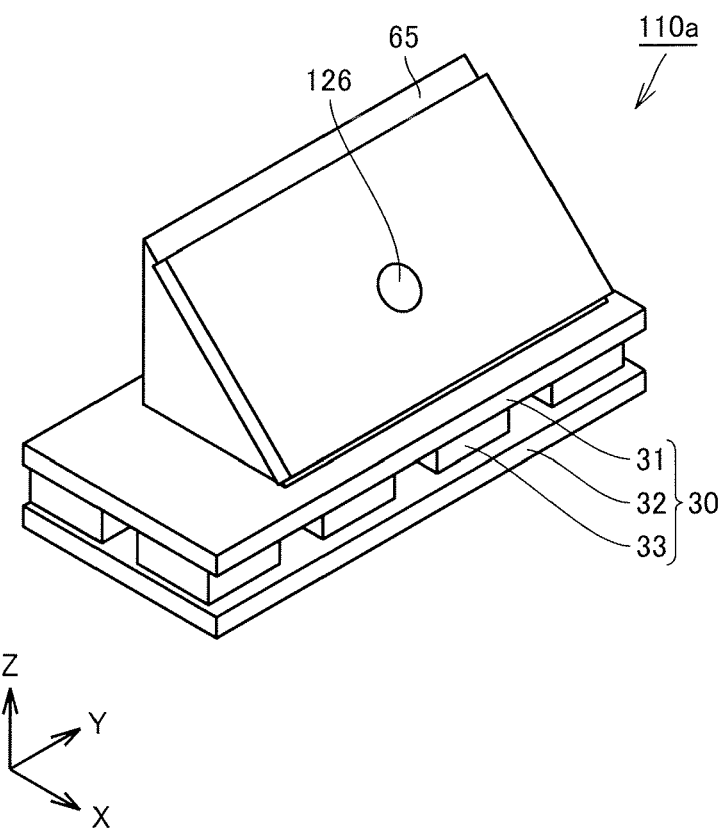
FIG. 3 is a schematic perspective view showing a structure of the mirror driving mechanism including a first electronic temperature adjusting module.

The mirror driving mechanism 110a may include a first electronic temperature adjusting module that adjusts the temperature of the mirror 126. FIG. 3 is a schematic perspective view showing a structure of the mirror driving mechanism 110a including the first electronic temperature adjusting module. In FIG. 3, the illustration of the mirror driving mechanism 110a is simplified. Referring to FIG. 3, in addition to having the configuration including, for example, the mirror 126, the mirror driving mechanism 110a in the present embodiment includes a mirror-driving-mechanism base 65 and a first electronic temperature adjusting module 30. The mirror-driving-mechanism base 65 has the shape of a triangular column (right-angled triangular column). The first electronic temperature adjusting module 30 is a Peltier module (Peltier element), which is an electronic cooling module. The first electronic temperature adjusting module 30 includes a heat-absorbing plate 31 and a heat-dissipating plate 32, which have a plate shape, and semiconductor columns 33 that are arranged side by side between the heat-absorbing plate 31 and the heat-dissipating plate 32 with an electrode (not shown) interposed therebetween. The heat-absorbing plate 31 and the heat-dissipating plate 32 are made of, for example, alumina. The heat-dissipating plate 32 is disposed in contact with the other members. One side surface of the triangular column of the mirror-driving-mechanism base 65 is disposed on the heat-absorbing plate 31 so as to contact the heat-absorbing plate 31. The mirror driving mechanism 110a including the mirror 126 is disposed on another side surface of the mirror-driving-mechanism base 65.

According to such a configuration, by controlling the temperature by the first electronic temperature adjusting module 30 based on temperature information detected by the temperature detecting section 128a, it becomes easy to adjust the temperature of the mirror 126 in a proper range.

In the above-described embodiment, although the temperature detecting section 128a is disposed on the one surface 121d of the second portion 117 in the plate-thickness direction so as to be situated in a region between the piezoelectric element 127b and the corresponding outer edge 124 of the second portion 117, the position of the temperature detecting section 128a is not limited thereto. For example, the temperature detecting section 128a may be disposed in a region between the piezoelectric element 127a and the corresponding outer edge 124 of the second portion. In this case, it is desirable that the temperature detecting section 128a be disposed as close as possible to the mirror 126. In addition, a plurality of the temperature detecting sections 128a may be disposed. Although the temperature detecting section 128a is described as being formed from a silicon diode, the structure is not limited thereto. The temperature detecting section 128a may be formed from, for example, a thermistor.

In the mirror driving mechanism 110a of the present disclosure, for example, the external shape of the base portion 111 is not limited to those shown in FIGS. 1 and 2. For example, other forms not including the pair of first portions 116a and 116b, other structures that support the mirror 126, or other structures that support the second portion 117 may be used.

Figure 4:
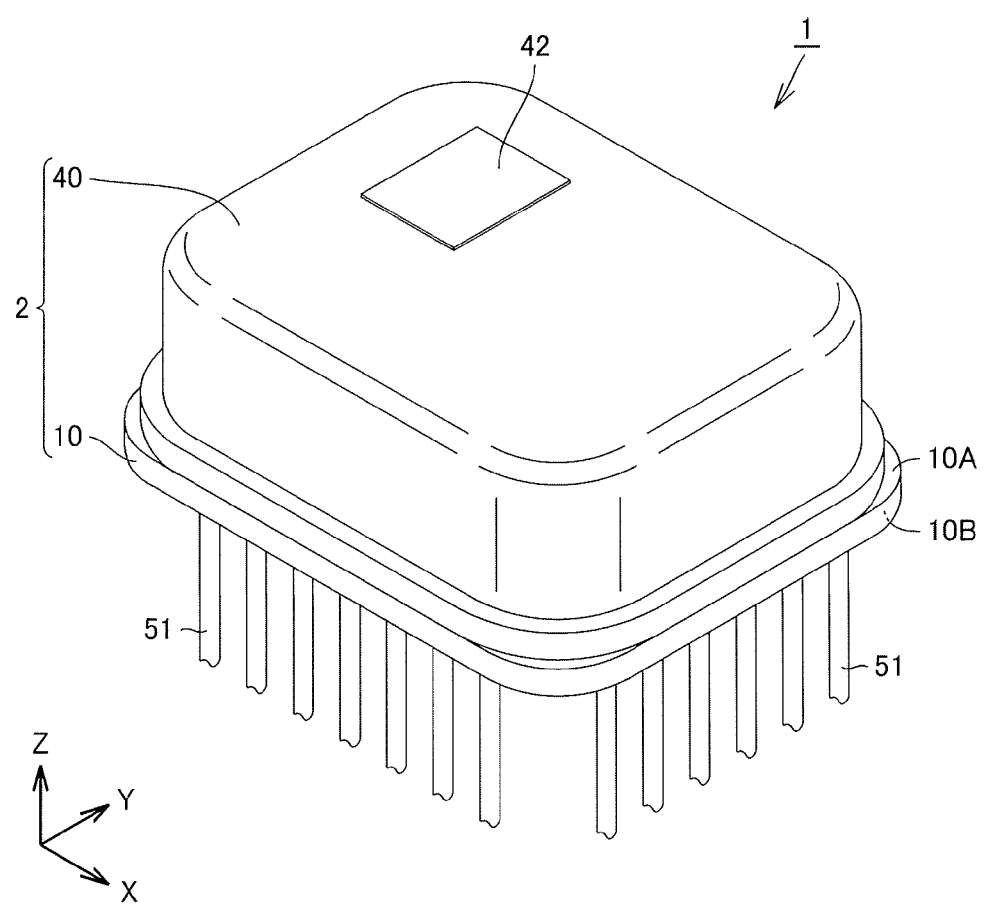
FIG. 4 is a schematic perspective view showing a structure of an optical module including the mirror driving mechanism.
Figure 5:
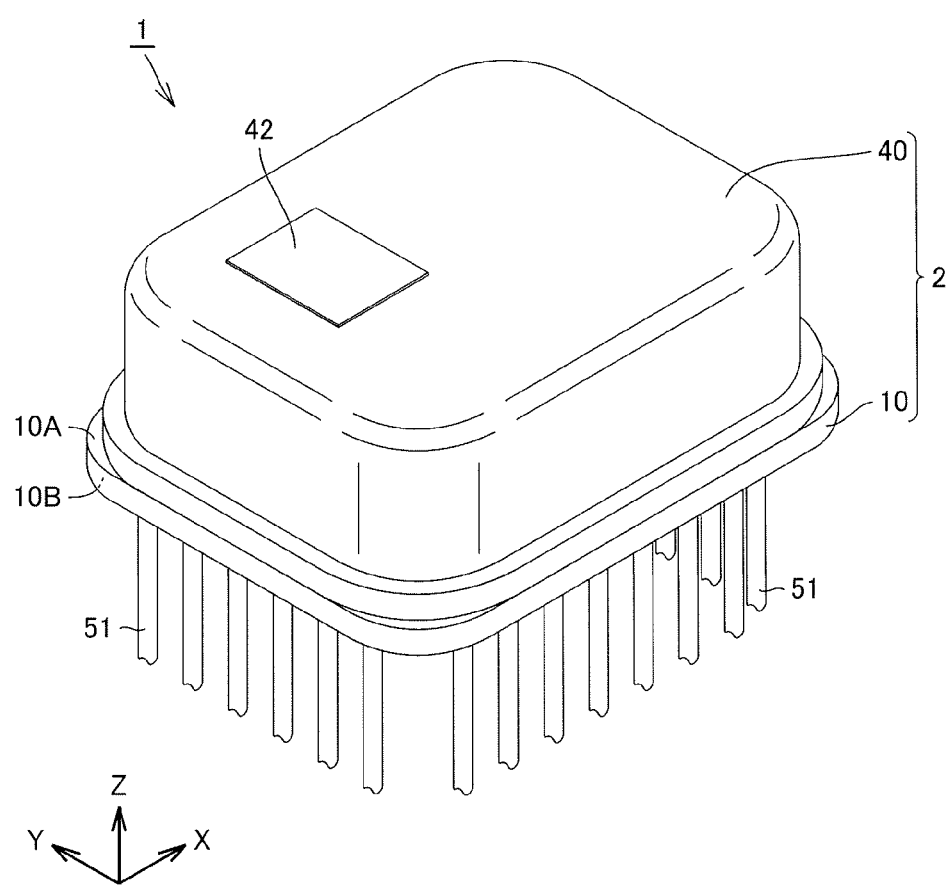
FIG. 5 is a schematic perspective view showing the structure of the optical module including the mirror driving mechanism.
Figure 6:
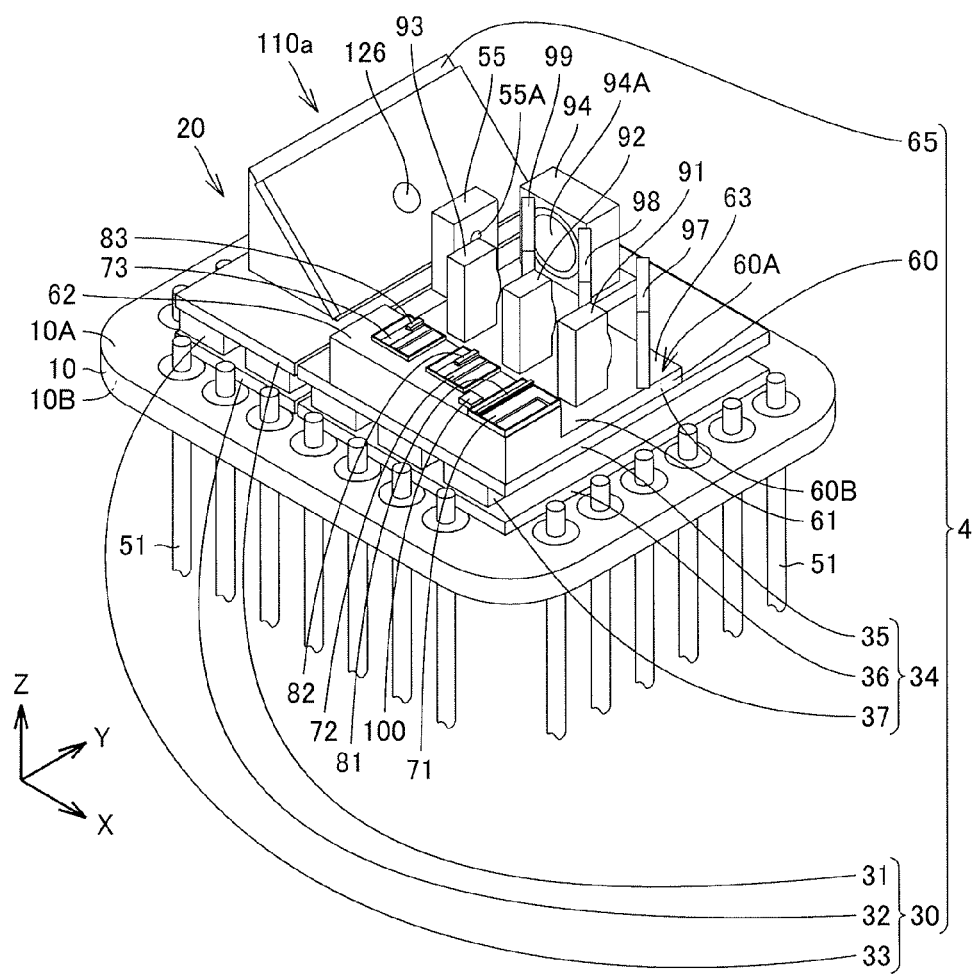
FIG. 6 is a perspective view corresponding to a state in which a cap in FIG. 4 has been removed.
Figure 7:
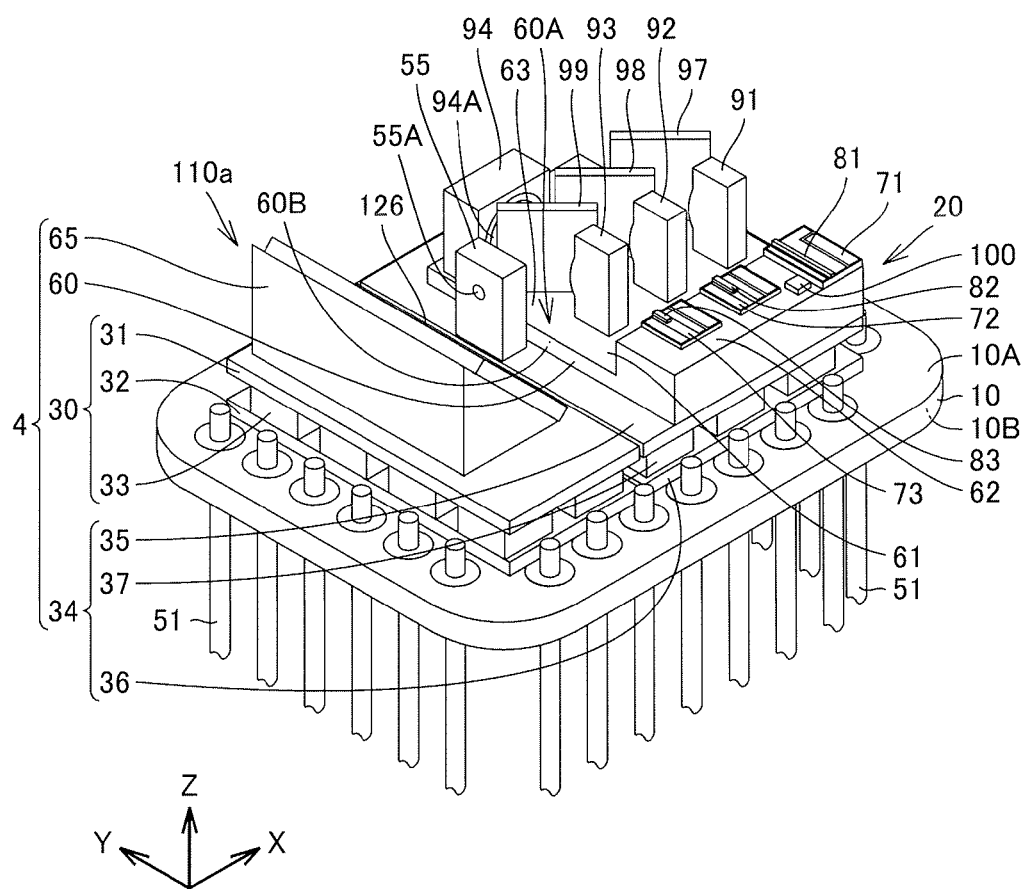
FIG. 7 is a perspective view corresponding to a state in which the cap in FIG. 5 has been removed.
Figure 8:
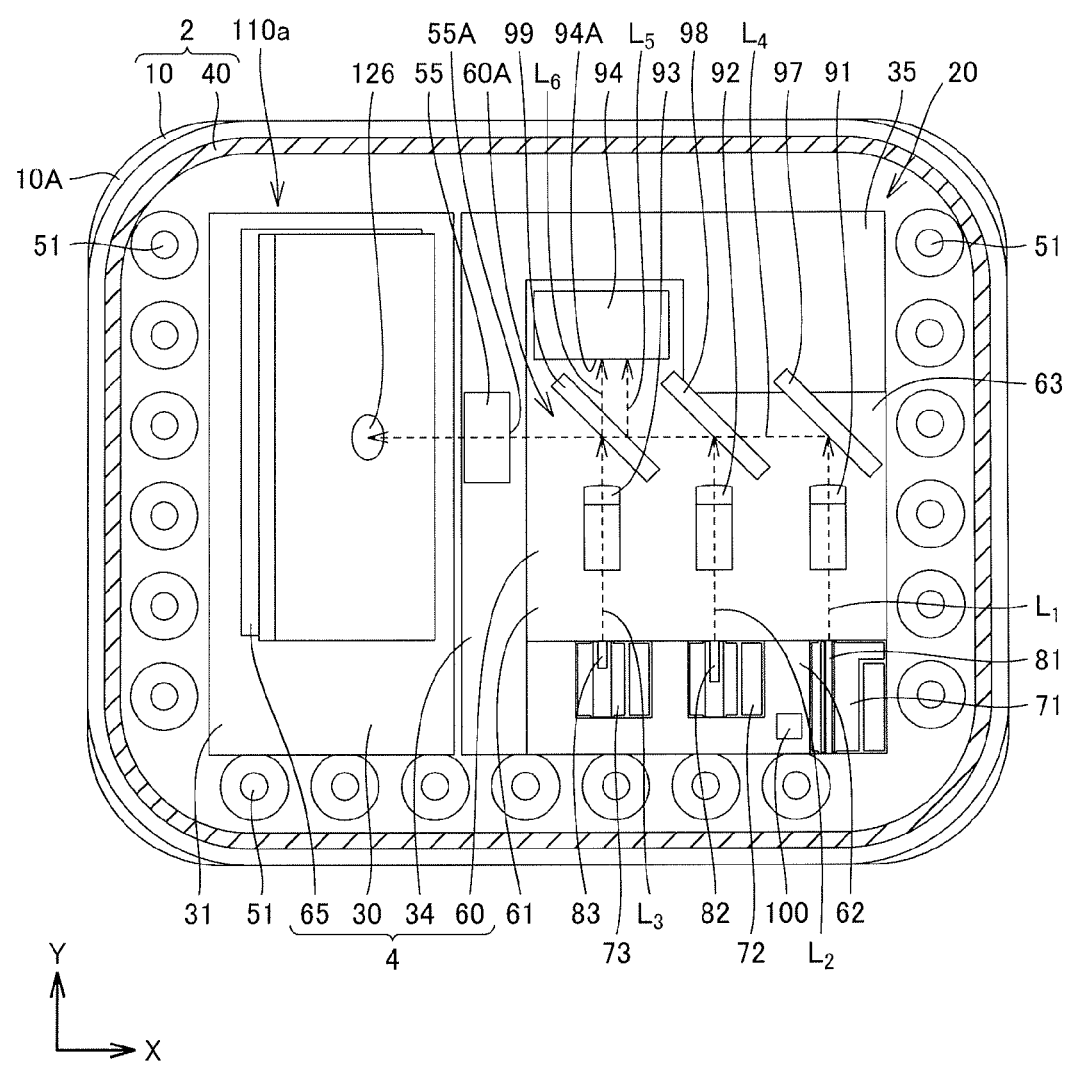
FIG. 8 is a schematic view in an X-Y plane in which the cap is shown in cross section and the other components are shown in plan view.
Figure 9:
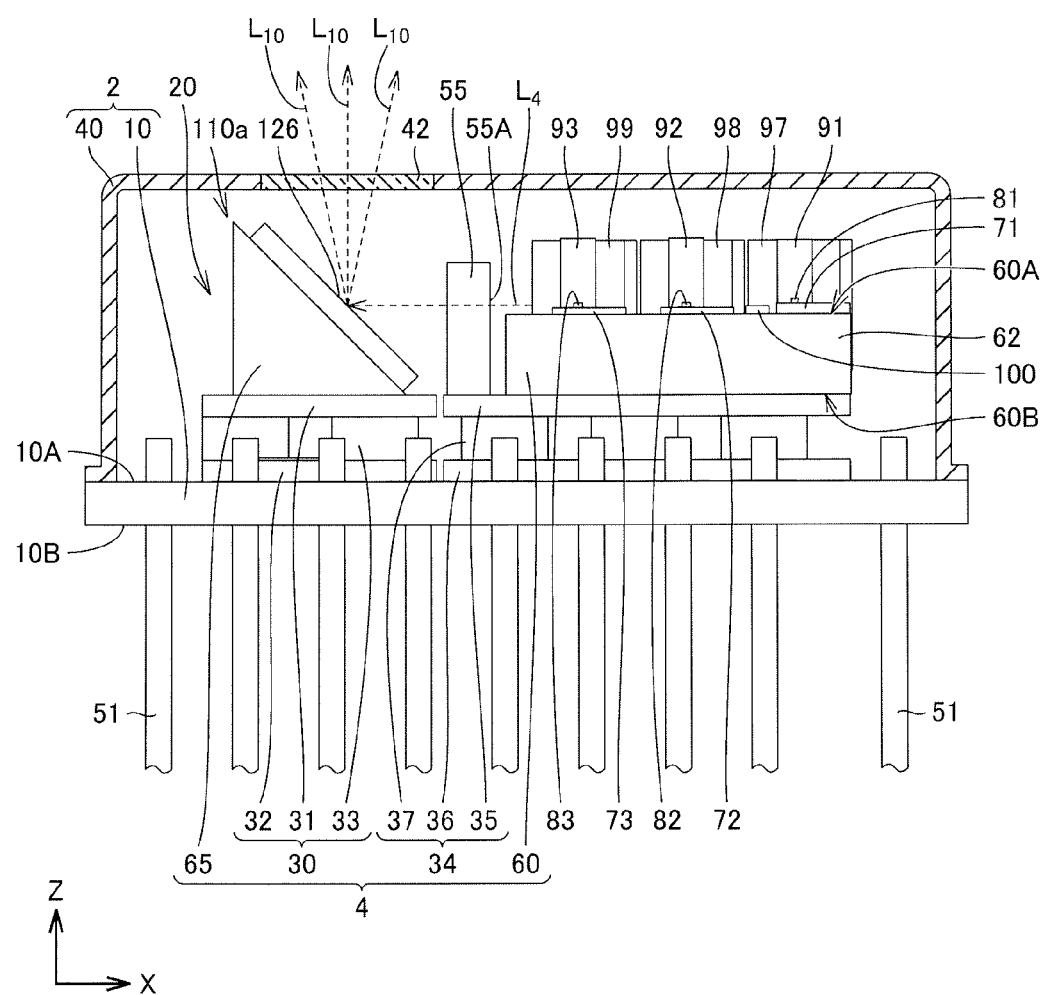
FIG. 9 is a schematic view in an X-Z plane in which the cap is shown in cross section and the other components are shown in plan view.

Next, a configuration of an optical module including the mirror driving mechanism 110a in the first embodiment is described with reference to FIGS. 4 to 9. FIG. 4 is a schematic perspective view showing a structure of the optical module including the mirror driving mechanism 110a. FIG. 5 is a schematic perspective view showing the structure of the optical module when viewed from a different observing point from FIG. 4. FIG. 6 is a perspective view corresponding to a state in which a cap 40 in FIG. 4 has been removed. FIG. 7 is a perspective view corresponding to a state in which the cap 40 in FIG. 5 has been removed. FIG. 8 is a schematic view in an X-Y plane in which the cap 40 is shown in cross section and the other components are shown in plan view. FIG. 9 is a schematic view in an X-Z plane in which the cap 40 is shown in cross section and the other components are shown in plan view. Even in FIGS. 6 to 9, the illustration of the mirror driving mechanism 110a is simplified.

With reference to FIGS. 4 to 9 at the same time, an optical module 1 in the present embodiment includes a light forming section 20 that forms light and a protective member 2 that surrounds the light forming section 20 and that seals the light forming section 20 therein. The protective member 2 includes a base section 10 that serves as a base body and the cap 40 that is a cover welded to the base section 10. That is, the light forming section 20 is hermetically sealed by the protective member 2. The base section 10 has a plate shape. The light forming section 20 is disposed on one principal surface 10A of the base section 10. The cap 40 is disposed in contact with the one principal surface 10A of the base section 10 so as to cover the light forming section 20. A plurality of lead pins 51 are installed in the base section 10 so as to extend therethrough from a side of another principal surface 10B to a side of the one principal surface 10A of the base section 10 and so as to protrude on both the side of the one principal surface 10A and the side of the other principal surface 10B. For example, a gas whose moisture content has been reduced (whose moisture has been removed), such as dry air, is sealed in a space that is surrounded by the base section 10 and the cap 40. The cap 40 has a window 42. For example, a parallel plate-shaped glass member is fitted to the window 42. In the present embodiment, the protective member 2 is an air-tight member whose interior is in an air-tight state. This makes it possible to effectively protect each member included in the light forming section 20 from the external environment and to ensure high reliability.

The light forming section 20 includes a base member 4, laser diodes 81, 82, and 83, lenses 91, 92, and 93, a photodiode 94 that is a light-receiving element, filters 97, 98, and 99, an aperture member 55, which is a beam shaping section, and the mirror driving mechanism 110a. The aperture member 55 shapes, in a cross section perpendicular to a direction of propagation of light rays that are emitted from the laser diodes 81, 82, and 83, the light rays that are emitted from the laser diodes 81, 82, and 83. The mirror driving mechanism 110a included in the light forming section 20 is, along with the laser diode 81, etc., hermetically sealed by the protective member 2.

The base member 4 includes the first electronic temperature adjusting module 30, a second electronic temperature adjusting module 34, a laser diode base 60, and the mirror-driving-mechanism base 65. As shown in FIG. 3 above, the first electronic temperature adjusting module 30 includes the heat-absorbing plate 31, the heat-dissipating plate 32, and the semiconductor columns 33. The first electronic temperature adjusting module 30 is disposed on the one principal surface 10A of the base section 10 so that the heat-dissipating plate 32 contacts the one principal surface 10A of the base section 10. The mirror-driving-mechanism base 65 and the mirror driving mechanism 110a are disposed on a side opposite to the third filter 99 (described below) when viewed from the aperture member 55.

The first electronic temperature adjusting module 30 is disposed between the base section 10 and the mirror-driving-mechanism base 65. The heat-absorbing plate 31 is disposed in contact with the mirror-driving-mechanism base 65. The heat-dissipating plate 32 is disposed in contact with the one principal surface 10A of the base section 10. The first electronic temperature adjusting module 30 is a Peltier module (Peltier element), which is an electronic cooling module. In the present embodiment, by causing electric current to flow through the first electronic temperature adjusting module 30, heat of the mirror-driving-mechanism base 65 in contact with the heat-absorbing plate 31 moves towards the base section 10, and the mirror-driving-mechanism base 65 is cooled. Here, the first electronic temperature adjusting module 30 controls the temperature based on temperature information detected by the temperature detecting section 128a.

Similarly to the first electronic temperature adjusting module 30, the second electronic temperature adjusting module 34 also includes a heat-absorbing plate 35 and a heat-dissipating plate 36, which have a plate shape, and semiconductor columns 37 that are arranged side by side between the heat-absorbing plate 35 and the heat-dissipating plate 36 with an electrode (not shown) interposed therebetween. The second electronic temperature adjusting module 34 is a Peltier module (Peltier element), which is an electronic cooling module. The heat-absorbing plate 35 and the heat-dissipating plate 36 are made of, for example, alumina. The second electronic temperature adjusting module 34 is disposed on the one principal surface 10A of the base section 10 so that the heat-dissipating plate 36 contacts the one principal surface 10A of the base section 10. The second electronic temperature adjusting module 34 is disposed apart from the first electronic temperature adjusting module 30 in an X direction. That is, the first electronic temperature adjusting module 30 and the second electronic temperature adjusting module 34 are capable of adjusting temperatures separately.

The second electronic temperature adjusting module 34 is disposed between the base section 10 and the laser diode base 60. The heat-absorbing plate 35 is disposed in contact with the laser diode base 60. The heat-dissipating plate 36 is disposed in contact with the one principal surface 10A of the base section 10. In the present embodiment, by causing electric current to flow through the second electronic temperature adjusting module 34, heat of the laser diode base 60 in contact with the heat-absorbing plate 35 moves towards the base section 10, and the laser diode base 60 is cooled. Here, the second electronic temperature adjusting module 34 controls temperature based on temperature information detected by a thermistor 100 disposed on the laser diode base 60 (described below). As a result, the temperatures of the laser diodes 81, 82, and 83 are adjusted in a proper temperature range.

The laser diode base 60 is disposed on the heat-absorbing plate 35 so as to contact the heat-absorbing plate 35. The laser diode base 60 has a plate shape. The laser diode base 60 includes one principal surface 60A having a rectangular shape (square shape) when viewed in the plate-thickness direction. The one principal surface 60A of the laser diode base 60 includes a lens installation region 61, a chip installation region 62, and a filter installation region 63. The chip installation region 62 is formed along one side of the one principal surface 60A in a region including the one side. The lens installation region 61 is adjacent to the chip installation region 62 and is disposed along the chip installation region 62. The filter installation region 63 is disposed along another side of the one principal surface 60A in a region including the other side facing the one side. The chip installation region 62, the lens installation region 61, and the filter installation region 63 are parallel to each other.

The thickness of the laser diode base 60 at the lens installation region 61 and the thickness of the laser diode base 60 at the filter installation region 63 are equal to each other. The lens installation region 61 and the filter installation region 63 are included in the same plane. The thickness of the laser diode base 60 at the chip installation region 62 is larger than the thickness of the laser diode base 60 at the lens installation region 61 and the thickness of the laser diode base 60 at the filter installation region 63. As a result, the height of the chip installation region 62 (the height with reference to the lens installation region 61, that is, the height in a direction perpendicular to the lens installation region 61) is larger than the heights of the lens installation region 61 and the filter installation region 63.

A plate-shaped first submount 71, a plate-shaped second submount 72, and a plate-shaped third submount 73 are disposed on the chip installation region 62 so as to be arranged side by side along the one side of the one principal surface 60A. The second submount 72 is disposed so as to be interposed between the first submount 71 and the third submount 73. The red laser diode 81 that serves as the first laser diode is disposed on the first submount 71. The green laser diode 82 that serves as the second laser diode is disposed on the second submount 72. The blue laser diode 83 that serves as the third laser diode is disposed on the third submount 73. The height of the optical axis of the red laser diode 81, the height of the optical axis of the green laser diode 82, and the height of the optical axis of the blue laser diode 83 (when the lens installation region 61 of the one principal surface 60A is a reference surface, the distance between the reference surface and each optical axis; the distance between the reference surface and each optical axis in a Z-axis direction) are made the same by adjusting the respective first submount 71, second submount 72, and third submount 73. The thermistor 100 that detects the temperature of the laser diode base 60 is disposed apart from the first submount 71 in the X direction on the chip installation region 62.

The first lens 91, the second lens 92, and the third lens 93 are disposed on the lens installation region 61. The first lens 91, the second lens 92, and the third lens 93 each have a lens surface at its corresponding surface. The center axis of the first lens 91, the center axis of the second lens 92, and the center axis of the third lens 93, that is, the optical axis of the first lens 91, the optical axis of the second lens 92, and the optical axis of the third lens 93 are aligned with the optical axis of the red laser diode 81, the optical axis of the green laser diode 82, and the optical axis of the blue laser diode 83. The first lens 91, the second lens 92, and the third lens 93 each convert a spot size of a light ray that is emitted from a corresponding one of the red laser diode 81, the green laser diode 82, and the blue laser diode 83 (or shapes a beam shape in a certain projection surface into a desired shape). The first lens 91, the second lens 92, and the third lens 93 convert the spot sizes of the light rays that are emitted from the respective red laser diode 81, green laser diode 82, and blue laser diode 83 so that the spot sizes are the same. The first lens 91, the second lens 92, and the third lens 93 each convert the light ray that is emitted from the corresponding one of the red laser diode 81, the green laser diode 82, and the blue laser diode 83 into a collimated light ray.

The first filter 97, the second filter 98, and the third filter 99 are disposed on the filter installation region 63. The first filter 97 is disposed on a straight line connecting the red laser diode 81 and the first lens 91 to each other. The second filter 98 is disposed on a straight line connecting the green laser diode 82 and the second lens 92 to each other. The third filter 99 is disposed on a straight line connecting the blue laser diode 83 and the third lens 93 to each other. The first filter 97, the second filter 98, and the third filter 99 have plate shapes having principal surfaces that are parallel to each other. The first filter 97, the second filter 98, and the third filter 99 are each, for example, a wavelength selection filter. The first filter 97, the second filter 98, and the third filter 99 are each, for example, a dielectric multilayer-film filter.

More specifically, the first filter 97 reflects a red light ray. The second filter 98 transmits a red light ray therethrough and reflects a green light ray. The third filter 99 transmits a red light ray and a green light ray therethrough and reflects a blue light ray. In this way, the first filter 97, the second filter 98, and the third filter 99 each selectively transmit and reflect a light ray having a particular wavelength. As a result, the first filter 97, the second filter 98, and the third filter 99 combine the light rays that are emitted from the respective red laser diode 81, green laser diode 82, and blue laser diode 83.

The aperture member 55 is disposed on the heat-absorbing plate 35. The aperture member 55 is disposed on a side opposite to the second filter 98 when viewed from the third filter 99. The aperture member 55 has a plate shape. The aperture member 55 has a through hole 55A extending therethrough in a thickness direction. In the present embodiment, the shape of the through hole 55A in a cross section perpendicular to a direction of extension of the through hole 55A is circular. The aperture member 55 is disposed so that the through hole 55A is positioned at a region corresponding to an optical path of light acquired by combining light rays at the first filter 97, the second filter 98, and the third filter 99. The through hole 55A extends along the optical path of the light acquired by combining the light rays at the first filter 97, the second filter 98, and the third filter 99. The shapes of the light rays, emitted from the respective laser diodes 81, 82, and 83, in the cross section perpendicular to the direction of propagation of light are elliptical. The aperture member 55 is disposed so that, in the cross section perpendicular to the direction of propagation of light, the diameter of the through hole 55A is smaller than the length of the major axis of the light acquired by combining the light rays at the filters 97, 98, and 99, and so that the center axis of the through hole 55A and the optical axis of the light acquired by combining the light rays are aligned with each other. As a result, the shape of the light, acquired by combining the light rays at the filters 97, 98, and 99, in the cross section perpendicular to the direction of propagation of light is made into a shape having a size that is smaller than the inside diameter of the through hole 55A of the aperture member 55.

Referring to FIG. 8, the red laser diode 81, the first lens 91, and the first filter 97 are arranged side by side (in a Y-axis direction) on a straight line along a direction of emission of the light ray from the red laser diode 81. The green laser diode 82, the second lens 92, and the second filter 98 are arranged side by side (in the Y-axis direction) on a straight line along a direction of emission of the light ray from the green laser diode 82. The blue laser diode 83, the third lens 93, and the third filter 99 are arranged side by side (in the Y-axis direction) on a straight line along a direction of emission of the light ray from the blue laser diode 83.

The direction of emission from the red laser diode 81, the direction of emission from the green laser diode 82, and the direction of emission from the blue laser diode 83 are parallel to each other. The principal surfaces of the first filter 97, the principal surfaces of the second filter 98, and the principal surfaces of the third filter 99 are inclined at an angle of 45 degrees with respect to the direction of emission (Y-axis direction) from the red laser diode 81, the direction of emission (Y-axis direction) from the green laser diode 82, and the direction of emission (Y-axis direction) from the blue laser diode 83, respectively.

The photodiode 94 is disposed on the one principal surface 60A of the laser diode base 60. The photodiode 94 includes a light-receiving portion 94A. The blue laser diode 83, the third lens 93, the third filter 99, and the light-receiving portion 94A of the photodiode 94 are arranged side by side (in the Y-axis direction) on the straight line along the direction of emission of the light ray from the blue laser diode 83. In the present embodiment, although the third filter 99 transmits a large part of the red light ray and the green light ray, the third filter 99 reflects a part of the red light ray and a part of the green light ray. The third filter 99 reflects a large part of the blue light ray, but transmits a part of the blue light ray.

Next, an operation of the optical module 1 in the present embodiment is described. Referring to FIG. 8, the red light ray emitted from the red laser diode 81 propagates along an optical path $L_1$. The red light ray is incident upon the first lens 91 and a spot size of the light ray is converted. Specifically, for example, the red light ray emitted from the red laser diode 81 is converted into a collimated light ray. The red light ray whose spot size has been converted by the first lens 91 propagates along the optical path $L_1$ and is incident upon the first filter 97.

Since the first filter 97 reflects the red light ray, the light ray emitted from the red laser diode 81 further propagates along an optical path $L_4$ and is incident upon the second filter 98. Since the second filter 98 transmits the red light ray therethrough, the light ray emitted from the red laser diode 81 further propagates along the optical path $L_4$ and is incident upon the third filter 99. Since the third filter 99 transmits the red light ray therethrough, the light ray emitted from the red laser diode 81 further propagates along the optical path $L_4$ and reaches the aperture member 55. The light ray that has reached the aperture member 55 is shaped by the aperture member 55, further propagates along the optical path $L_4$, and reaches the mirror 126.

A green light ray emitted from the green laser diode 82 propagates along an optical path $L_2$. The green light ray is incident upon the second lens 92 and a spot size of the light ray is converted. Specifically, for example, the green light ray emitted from the green laser diode 82 is converted into a collimated light ray. The green light ray whose spot size has been converted by the second lens 92 propagates along the optical path $L_2$ and is incident upon the second filter 98.

Since the second filter 98 reflects the green light ray, the light ray emitted from the green laser diode 82 further propagates along the optical path $L_4$ and is incident upon the third filter 99. Since the third filter 99 transmits the green light ray therethrough, the light ray emitted from the green laser diode 82 further propagates along the optical path $L_4$ and reaches the aperture member 55. The green light ray that has reached the aperture member 55 is shaped by the aperture member 55, further propagates along the optical path $L_4$, and reaches the mirror 126.

A blue light ray emitted from the blue laser diode 83 propagates along an optical path $L_3$. The blue light ray is incident upon the third lens 93 and a spot size of the light ray is converted. Specifically, for example, the blue light ray emitted from the blue laser diode 83 is converted into a collimated light ray. The blue light ray whose spot size has been converted by the third lens 93 propagates along the optical path $L_3$ and is incident upon the third filter 99.

Since the third filter 99 reflects the blue light ray, the light ray emitted from the blue laser diode 83 further propagates along the optical path $L_4$ and reaches the aperture member 55. The blue light ray that has reached the aperture member 55 is shaped by the aperture member 55, further propagates along the optical path $L_4$, and reaches the mirror 126.

In this way, light formed by combining the red light ray, the green light ray, and the blue light ray (combined light) propagates along the optical path $L_4$ and reaches the mirror 126. Then, referring to FIG. 9, scanning is performed by using the combined light as a result of driving the mirror 126, and the combined light propagates along optical paths $L_{10}$, passes through the window 42, and exits to the outside of the cap 40 to draw, for example, characters and figures.

As described above, the optical module 1 includes the mirror driving mechanism 110a. Since the mirror driving mechanism 110a includes the temperature detecting section 128a that is mounted on the base portion 111, it is possible to precisely detect the temperature of the mirror 126. Therefore, based on the detected temperature of the thin portion 113, it is possible to strictly control the temperature of the thin portion 113 and to adjust the temperature of the thin portion 113 including the mirror 126 in a proper range. Consequently, such an optical module 1 is capable of operating stably.

That is, for example, when the optical module 1 is installed in an automobile, the optical module 1 may be used in a wide temperature range, such as −45° C. to 95° C. Even in such a case, by controlling the temperature by the first electronic temperature adjusting module 30 based on the temperature of the mirror 126 detected by the above-described temperature detecting section 128a, it is possible to adjust the temperature of the mirror 126 in a proper range and to increase the stability of the operation with respect to temperature changes.

The optical module 1 includes the second electronic temperature adjusting module 34 that adjusts the temperature of the laser diode base 60 serving as a base member on which the laser diodes 81, 82, and 83 are installed. The light rays that are emitted by the laser diodes 81, 82, and 83 depend upon temperature. Due to such a configuration, by using the second electronic temperature adjusting module 34 that differs from the first electronic temperature adjusting module 30 that adjusts the temperature of the mirror 126 of the above-described mirror driving mechanism 110a, it is possible to adjust the temperatures of the laser diodes 81, 82, and 83 separately from adjusting the temperature of the mirror driving mechanism 110a. Therefore, it is possible to properly adjust the temperatures of the laser diodes 81, 82, and 83, and to increase the stability of the operation with respect to temperature changes.

A part of the red light ray and a part of the green light ray that have reached the third filter 99 are reflected by the third filter 99, propagate along an optical path $L_5$ and an optical path $L_6$, and are incident upon the light-receiving portion 94A of the photodiode 94. In addition, a part of the blue light ray that has reached the third filter 99 is transmitted through the third filter 99, propagates along the optical path $L_6$, and is incident upon the light-receiving portion 94A of the photodiode 94. Then, based on information about the intensities of the red light ray, the green light ray, and the blue light ray received by the photodiode 94, the values of electric currents flowing through the red laser diode 81, the green laser diode 82, and the blue laser diode 83 are adjusted. That is, in the present embodiment, the red laser diode 81, the green laser diode 82, and the blue laser diode 83 can be controlled by auto power control (APC) driving. This makes it possible to strictly control the laser diodes 81, 82, and 83. That is, it is possible to properly adjust the outputs of the laser diodes 81, 82, and 83 based on the outputs of the light rays that are received by the photodiode 94.

The optical module 1 includes the aperture member 55, which is a beam-shaping section, that shapes, in the cross section perpendicular to the direction of propagation of the light rays that are emitted from the laser diodes 81, 82, and 83, the light rays that are emitted from the laser diodes 81, 82, and 83. Therefore, the mirror 126 is capable of reflecting the light rays shaped into desired shapes.

Since the optical module 1 includes the lenses 91, 92, and 93 that convert the spot sizes of the light rays that are emitted from the laser diodes 81, 82, and 83, respectively, it is possible to emit the light rays having desired spot sizes from the optical module 1.

Since the optical module 1 includes a plurality of laser diodes, that is, the laser diodes 81, 82, and 83, and the filters 98 and 99 that combine the light rays that are emitted from the laser diodes 81, 82, and 83, it is possible to emit light acquired by combining the light rays emitted from the laser diodes 81, 82, and 83 from the optical module 1. In this case, since the laser diodes 81, 82, and 83 correspond to the red laser diode 81 that emits a red light ray, the green laser diode 82 that emits a green light ray, and the blue laser diode 83 that emits a blue light ray, respectively, it is possible to combine the light rays and form the light having a desired color.

The optical module 1 uses the aperture member 55 as a beam shaping section. Although, as the beam shaping section, for example, a lens or a prism may be used, when the aperture member 55 is used as a beam shaping section, it is possible to reduce manufacturing costs of the optical module 1.

In the optical module 1, the outside diameter of the mirror 126 may be greater than or equal to the beam diameter of the light shaped by the aperture member 55 (the diameter of the light in the cross section perpendicular to the direction of propagation of light). This allows light with which scanning is not performed at the mirror 126 even though the light has reached the mirror driving mechanism 110a to be reflected at a location other than the mirror 126 to suppress such light from becoming the cause of stray light.

Second Embodiment

Next, a second embodiment, which is another embodiment, is described. A mirror driving mechanism 110b in the second embodiment differs from that in the first embodiment in the position where a temperature detecting section is mounted.

Figure 10:
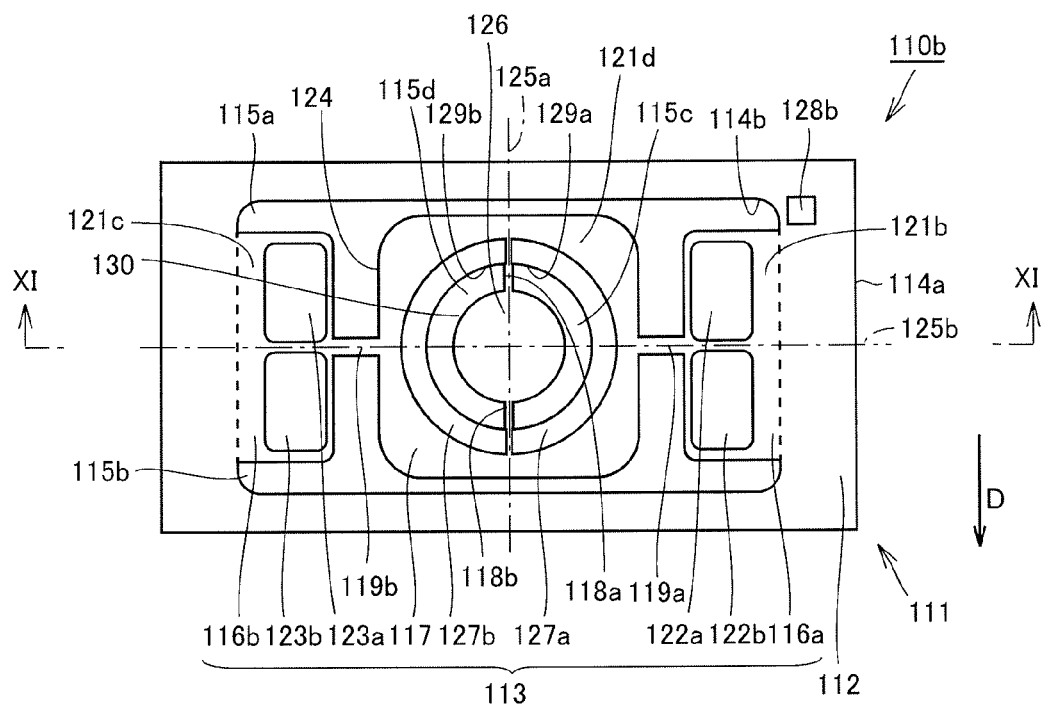
FIG. 10 is a schematic plan view showing a mirror driving mechanism in a second embodiment.
Figure 11:
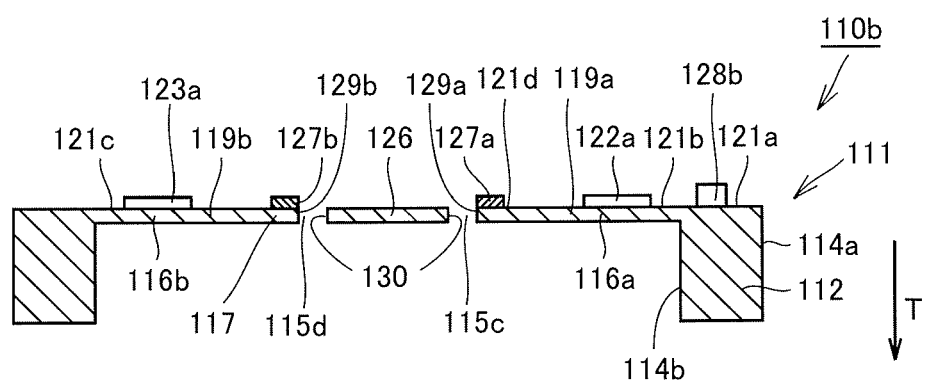
FIG. 11 is a schematic sectional view of the mirror driving mechanism in the second embodiment, the mirror driving mechanism being cut along a line segment XI-XI.

FIG. 10 is a schematic plan view showing the mirror driving mechanism in the second embodiment. FIG. 11 is a schematic sectional view of the mirror driving mechanism in the second embodiment, the mirror driving mechanism being cut along a line segment XI-XI.

Referring to FIGS. 10 and 11, the mirror driving mechanism 110b in the second embodiment includes a temperature detecting section 128b that is installed on a base portion 111. The temperature detecting section 128b is mounted on a thick portion 112. Specifically, the temperature detecting section 128b is installed on a surface 121a of the thick portion 112. More specifically, the temperature detecting section 128b is installed on the surface 121a of the thick portion 112 in a region near a piezoelectric element 122a and near a corner portion of the base portion 111.

This makes it easy to install the temperature detecting section 128b on the base portion 111.

Other Embodiments

Although, in the above-described embodiments, the light forming section 20 of the optical module 1 is described as including the photodiode 94, which is a light-receiving element, the light forming section 20 is not limited thereto, and may be configured so as not to include the photodiode 94 and that uses, instead of APC driving, auto current control (ACC) driving to determine the values of electric currents flowing through the laser diodes based on desired light intensities. This makes it possible to omit the photodiode 94 and to reduce manufacturing costs of the optical module 1. When the relationship between the electric currents flowing through the laser diodes and the intensities of the light rays that are emitted from the laser diodes changes due to changes in temperature, it becomes difficult to properly control the light intensities. In the optical module 1 of the present disclosure, this drawback can be compensated for by adjusting the temperatures of the laser diodes by using the second electronic temperature adjusting module 34.

Although, in the above-described embodiments, the optical module 1 is described as including the second electronic temperature adjusting module 34, the configuration is not limited thereto. The optical module 1 may be configured so as not to include the second electronic temperature adjusting module 34. In this case, for example, the laser diode base 60 is disposed on the base section 10 and is adjusted in height.

Although, in the above-described embodiments, the case in which light rays from three laser diodes are combined is described, two or four or more laser diodes may be used. Although, in the above-described embodiments, the case in which wavelength selection filters are used as the first filter 97, the second filter 98, and the third filter 99 is exemplified, such filters may be, for example, polarization synthesizing filters.

The embodiments disclosed herein are illustrative in all respects and should be understood as being non-limitative in any perspective. The scope of the present disclosure is defined by the claims rather than by the description above. The scope of the present disclosure is intended to embrace all changes within the meaning and range of equivalency of the claims.

REFERENCE SIGNS LIST 1 optical module
2 protective member
4 base member
10 base section
10A, 10B principal surface
20 light forming section
30 first electronic temperature adjusting module
31, 35 heat-absorbing plate
32, 36 heat-dissipating plate
33, 37 semiconductor column
34 second electronic temperature adjusting module
40 cap
42 window
51 lead pin
55 aperture member
55A through hole
60 laser diode base
60A, 60B principal surface
61 lens installation region
62 chip installation region
63 filter installation region
65 mirror-driving-mechanism base
71 first submount
72 second submount
73 third submount
81 red laser diode
82 green laser diode
83 blue laser diode
91 first lens
92 second lens
93 third lens
94 photodiode
94A light-receiving portion
97 first filter
98 second filter
99 third filter
100 thermistor
110a, 110b mirror driving mechanism
111 base portion
112 thick portion
113 thin portion
114a, 124, 130 outer edge
114b inner edge
115a, 115b, 115c, 115d through hole
116a, 116b first portion
117 second portion
118a, 118b first shaft portion
119a, 119b second shaft portion
121a, 121b, 121c, 121d surface
122a, 122b, 123a, 123b, 127a, 127b piezoelectric element
125a, 125b imaginary line
126 mirror
128a, 128b temperature detecting section
129a, 129b outer periphery

The invention claimed is:

1. A mirror driving mechanism comprising:
a plate-shaped base portion;
a mirror that is installed at the base portion; and
a temperature detecting section that is installed at the base portion and that detects a temperature of the base portion,
wherein the base portion includes
a thin portion that is disposed away from an outer edge of the base portion and that has a through hole extending through the base portion in a plate-thickness direction of the base portion,
a thick portion that is connected to the thin portion, that is thicker than the thin portion in the plate-thickness direction of the base portion, and that extends along the outer edge so as to surround the thin portion, and
a pair of first shaft portions that extend into the through hole from an outer periphery of the through hole,
wherein the thin portion includes
a first portion that is connected to the thick portion, and
a second portion that is connected to the first portion and that has the through hole, wherein the base portion includes
a pair of second shaft portions that extends in a direction orthogonal to the pair of first shaft portions and that connects the first portion and the second portion to each other,
wherein the thin portion includes
a first piezoelectric element installed at the second portion, the first piezoelectric element configured to swing the mirror with a first imaginary line extending through the pair of first shaft portions as a first center axis of swinging, and
a second piezoelectric element installed at the first portion, the second piezoelectric element configured to swing the mirror with a second imaginary line extending through the pair of second shaft portions as a second center axis of swinging,
wherein the mirror is supported by the pair of first shaft portions,
wherein the thin portion includes a silicon layer,
wherein the temperature detecting section is a silicon diode that is disposed on the silicon layer, and
wherein the first piezoelectric element and the second piezoelectric element are disposed on the silicon layer.

2. The mirror driving mechanism according to claim 1, wherein the temperature detecting section is installed at the second portion.

3. The mirror driving mechanism according to claim 1, wherein the mirror is swingable with the pair of second shaft portions being the swing axis.

4. The mirror driving mechanism according to claim 1, wherein the mirror is swingable with the pair of first shaft portions being the swing axis.

5. The mirror driving mechanism according to claim 1, further comprising:
a first electronic temperature adjusting module that adjusts a temperature of the mirror driving mechanism by controlling an output based on a signal from the temperature detecting section.

6. The mirror driving mechanism according to claim 1, wherein an intersection of the first imaginary line and the second imaginary line passes through a center of the mirror.

7. An optical module comprising:
the mirror driving mechanism according to claim 1; and
a laser diode that emits a light ray with which scanning is performed by driving the mirror.

8. The optical module according to claim 7, further comprising:
a base member where the laser diode is installed; and
a second electronic temperature adjusting module that adjusts a temperature of the base member.

9. The optical module according to claim 8, further comprising:
a beam shaping section that shapes, in a cross section perpendicular to a direction of propagation of the light ray that is emitted from the laser diode, the light ray that is emitted from the laser diode.

10. The optical module according to claim 8, wherein a plurality of the laser diodes are provided,
wherein the optical module further comprises a filter that combines a plurality of the light rays that are emitted from the plurality of laser diodes, and
wherein the plurality of laser diodes include
a red laser diode that emits a red light ray,
a green laser diode that emits a green light ray, and
a blue laser diode that emits a blue light ray.

11. The optical module according to claim 7, further comprising:
a beam shaping section that shapes, in a cross section perpendicular to a direction of propagation of the light ray that is emitted from the laser diode, the light ray that is emitted from the laser diode.

12. The optical module according to claim 11, wherein a plurality of the laser diodes are provided,
wherein the optical module further comprises a filter that combines a plurality of the light rays that are emitted from the plurality of laser diodes, and
wherein the plurality of laser diodes include
a red laser diode that emits a red light ray,
a green laser diode that emits a green light ray, and
a blue laser diode that emits a blue light ray.

13. The optical module according to claim 7, further comprising:
a light-receiving element that receives the light ray that is emitted from the laser diode.

14. The optical module according to claim 13, wherein a plurality of the laser diodes are provided,
wherein the optical module further comprises a filter that combines a plurality of the light rays that are emitted from the plurality of laser diodes, and
wherein the plurality of laser diodes include
a red laser diode that emits a red light ray,
a green laser diode that emits a green light ray, and
a blue laser diode that emits a blue light ray.

15. The optical module according to claim 7, further comprising:
a lens that converts a spot size of the light ray that is emitted from the laser diode.

16. The optical module according to claim 15, wherein a plurality of the laser diodes are provided,
wherein the optical module further comprises a filter that combines a plurality of the light rays that are emitted from the plurality of laser diodes, and
wherein the plurality of laser diodes include
a red laser diode that emits a red light ray,
a green laser diode that emits a green light ray, and
a blue laser diode that emits a blue light ray.

17. The optical module according to claim 7, wherein a plurality of the laser diodes are provided,
wherein the optical module further comprises a filter that combines a plurality of the light rays that are emitted from the plurality of laser diodes, and
wherein the plurality of laser diodes include
a red laser diode that emits a red light ray,
a green laser diode that emits a green light ray, and
a blue laser diode that emits a blue light ray.

* * * * *